(12) United States Patent
Song

(10) Patent No.: US 7,286,418 B2
(45) Date of Patent: *Oct. 23, 2007

(54) INTERNAL VOLTAGE SUPPLY CIRCUIT

(75) Inventor: Ho Uk Song, Icheon-si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/464,183

(22) Filed: Aug. 11, 2006

(65) Prior Publication Data

US 2006/0291318 A1   Dec. 28, 2006

Related U.S. Application Data

(63) Continuation of application No. 11/109,010, filed on Apr. 19, 2005, now Pat. No. 7,106,647.

(30) Foreign Application Priority Data

Oct. 7, 2004   (KR) .............................. 2004-80125

(51) Int. Cl.
*G11C 11/34* (2006.01)
(52) U.S. Cl. .................... 365/189.09; 327/541
(58) Field of Classification Search ................ 365/226, 365/189.09; 327/541
See application file for complete search history.

(56) References Cited

U.S. PATENT DOCUMENTS

| | | | |
|---|---|---|---|
| 6,873,561 B2 * | 3/2005 | Ooishi ........................ 365/226 |
| 6,922,098 B2 * | 7/2005 | Choi et al. ................... 327/538 |
| 7,019,720 B2 | 3/2006 | LeChevalier | |
| 7,034,781 B2 | 4/2006 | Irmer et al. | |
| 7,106,647 B2 | 9/2006 | Song | |
| 2002/0003737 A1 | 1/2002 | Wada et al. | |
| 2002/0031027 A1 | 3/2002 | Suematsu et al. | |
| 2002/0109531 A1 | 8/2002 | Pyo | |
| 2003/0117852 A1 | 6/2003 | Joo | |
| 2003/0185078 A1 * | 10/2003 | Tsukude ..................... 365/222 |
| 2006/0087889 A1 | 4/2006 | Jeong | |

* cited by examiner

*Primary Examiner*—Michael T Tran
(74) *Attorney, Agent, or Firm*—Marshall Gerstein & Borun LLP.

(57) ABSTRACT

Disclosed herein is an internal voltage supply circuit for a semiconductor device. The internal voltage supply circuit includes a first voltage driver for supplying a first voltage in response to a first enable signal, a second voltage driver for supplying a second voltage in response to a second enable signal, and a first enable signal generator for generating the first enable signal having an enable period of a desired time according to a current drive capability of the semiconductor device. The enable period is set to be shorter than a predetermined reference period when the current drive capability of the semiconductor device is higher than a predetermined reference current drive capability, and the enable period is set to be longer than the reference period when the current drive capability of the semiconductor device is lower than the reference current drive capability.

12 Claims, 6 Drawing Sheets

INTERNAL VOLTAGE SUPPLY CIRCUIT

CROSS-REFERENCE TO RELATED APPLICATION

This patent is a continuation of U.S. Ser. No. 11/109,010, filed Apr. 19, 2005, now U.S. Pat. No. 7,106,647, the disclosure of which is hereby expressly incorporated herein for all purposes.

BACKGROUND

1. Technical Field

An internal voltage supply circuit is disclosed for controlling an internal voltage supplied to an input/output sense amplifier in accordance with a current drive capability of a semiconductor device.

2. Description of the Related Art

Generally, manufacturing conditions or environments during the semiconductor chip manufacturing processes may lead to differences in performance among the semiconductor devices. Furthermore, as a semiconductor device operates at a high speed, such a different quality in manufacturing may degrade performance of the semiconductor device, such as current drive capability. In particular, this problem may occur in the core circuit of a semiconductor device in an active operation, which will hereinafter be described with reference to FIGS. 1 and 2.

FIG. 1 shows a core circuit of a conventional semiconductor device, more particularly a circuit that includes an input/output sense amplifier and a circuit for supplying a voltage to the input/output sense amplifier. As shown in FIG. 1, the input/output sense amplifier 120 is operated by receiving, as a source voltage, a high voltage Vpp or core voltage Vcore applied from the sense amplifier voltage supply circuit, denoted by reference numeral 110. This configuration is adopted and used currently in dynamic random access memory (DRAM) products of 533 MHz or more, beginning with products prior to synchronous DRAMs (SDRAMs).

The circuit of FIG. 1 is operated in the following manner. First, if a word line is turned on, then the sense amplifier 120 senses a potential difference between a bit line BIT and a complementary bit line /BIT. At this time, an N-channel Metal-Oxide Semiconductor (NMOS) transistor N11 is first turned on in response to a high voltage enable signal SAP1 to apply the high voltage Vpp as the source voltage to the sense amplifier 120, thereby causing the level of a node A to become the level of the high voltage Vpp. Thereafter, when a certain period of time has elapsed, a core voltage enable signal SAP2 is enabled to turn on an NMOS transistor N12, whereas the high voltage enable signal SAP1 is disabled to turn off the NMOS transistor N11. As a result, the core voltage Vcore is applied as the source voltage to the sense amplifier 120, so the level of the node A is maintained at the level of the core voltage Vcore.

FIG. 2 shows signal waveforms at respective parts of the circuit of FIG. 1, based on the high voltage enable signal SAP1 and core voltage enable signal SAP2. As can be seen from this drawing, a voltage at the node A, which is the source voltage of the sense amplifier 120, rises to the high voltage Vpp level in an enable period of the high voltage enable signal SAP1 and then falls to and is maintained at the core voltage Vcore level in a disable period of the high voltage enable signal SAP1.

However, the above-mentioned conventional semiconductor device has a disadvantage in that it may be degraded in its electrical characteristics, such as alternating current (AC) characteristics, or increased in current consumption, because a high voltage Vpp application period is constant irrespective of differences in performance, such as a current drive capability, among semiconductor devices resulting from different environments or conditions about a semiconductor chip manufacturing processes. That is, in the case where the conventional semiconductor device is poor in its overall performance including current drive capability due to conditions of the manufacturing process, the high voltage Vpp is so insufficiently supplied as to cause a shortage in the current drive capability. On the contrary, in the case where the conventional semiconductor device has good overall performance, the high voltage Vpp is so excessively supplied as to increase unnecessary current consumption.

SUMMARY OF THE DISCLOSURE

In view of the above problems, an internal voltage supply circuit is disclosed which is capable of controlling an internal voltage to be used as a source voltage of an input/output sense amplifier by reflecting differences in current drive capability among semiconductor devices based on wafer manufacturing process conditions, so as to improve electrical characteristics of the semiconductor devices and reduce unnecessary current consumption thereof, thereby increasing energy efficiencies of the semiconductor devices.

A disclosed internal voltage supply circuit for a semiconductor device comprises: a first voltage driver for supplying a first voltage in response to a first enable signal; a second voltage driver for supplying a second voltage in response to a second enable signal; and a first enable signal generator for generating the first enable signal having an enable period of a desired time according to a current drive capability of the semiconductor device, wherein the enable period is (i) set to be shorter than a predetermined reference period when the current drive capability of the semiconductor device is higher than a predetermined reference current drive capability, or (ii) to be longer than the reference period when the current drive capability of the semiconductor device is lower than the reference current drive capability.

The second enable signal may be enabled after the first enable signal is changed from its enabled state to disabled state.

The first enable signal generator may include a plurality of enable period adjusters for receiving an initial enable signal and generating a plurality of enable signals having different enable periods, respectively.

The enable period adjusters each may include: a delay for delaying the initial enable signal by a predetermined time; and a logic device for performing a logic operation with respect to an output signal from the delay and the initial enable signal to output a corresponding signal from a plurality of enable signals.

The logic device may be a NAND gate.

Preferably, the delays in the enable period adjusters have different delay times.

The first enable signal generator may further include: a signal combiner for combining a plurality of driver enable signals for adjustment of a drive capability of an output driver according to the current drive capability of the semiconductor device to generate a plurality of gate enable signals; and a transfer gate circuit for outputting any one of the plurality of enable signals as the first enable signal in response to the plurality of gate enable signals.

The transfer gate circuit may include a plurality of transfer gates each for performing an on/off switching operation in response to a corresponding one of the plurality of gate enable signals.

The semiconductor device may also include an off-chip driver (OCD) function.

Each of the first voltage driver and second voltage driver may include an N-channel Metal-Oxide Semiconductor (NMOS) device.

The first voltage may be a high voltage and the second voltage may be a core voltage.

Preferably, each of the first voltage and second voltage is used as a source voltage of an input/output sense amplifier of the semiconductor device.

The semiconductor device may be a double data rate (DDR) synchronous dynamic random access memory (SDRAM).

BRIEF DESCRIPTION OF THE DRAWINGS

The above and other features of the disclosed circuits will be more clearly understood from the following detailed description taken in conjunction with the accompanying drawings, wherein.

DESCRIPTION OF THE PREFERRED EMBODIMENTS

A double data rate (DDR) SDRAM is one of the proposed new standards to replace a regular SDRAM in order to overcome the limitations of the SDRAM resulting from a continuous increase in system bus speed. The DDR SDRAM is essentially similar in function to the regular SDRAM, but doubles the bandwidth of the memory by transferring data twice per cycle (i.e., on both rising and falling edges of a clock signal).

A DDR II SDRAM, which is the second-generation DDR SDRAM, further includes, in addition to existing functions, an off-chip driver (OCD) function of increasing or reducing the output drive strength stepwise to control the output drive strength for impedance adjustment. This OCD function is additionally provided to perform impedance matching of internal data, or Dout signal, by controlling the output drive strength. A semiconductor device with the OCD function is designed to control the output drive strength according to a current drive capability thereof determined depending on factors, such as conditions and/or environments during a semiconductor chip manufacturing process.

Figure 1:
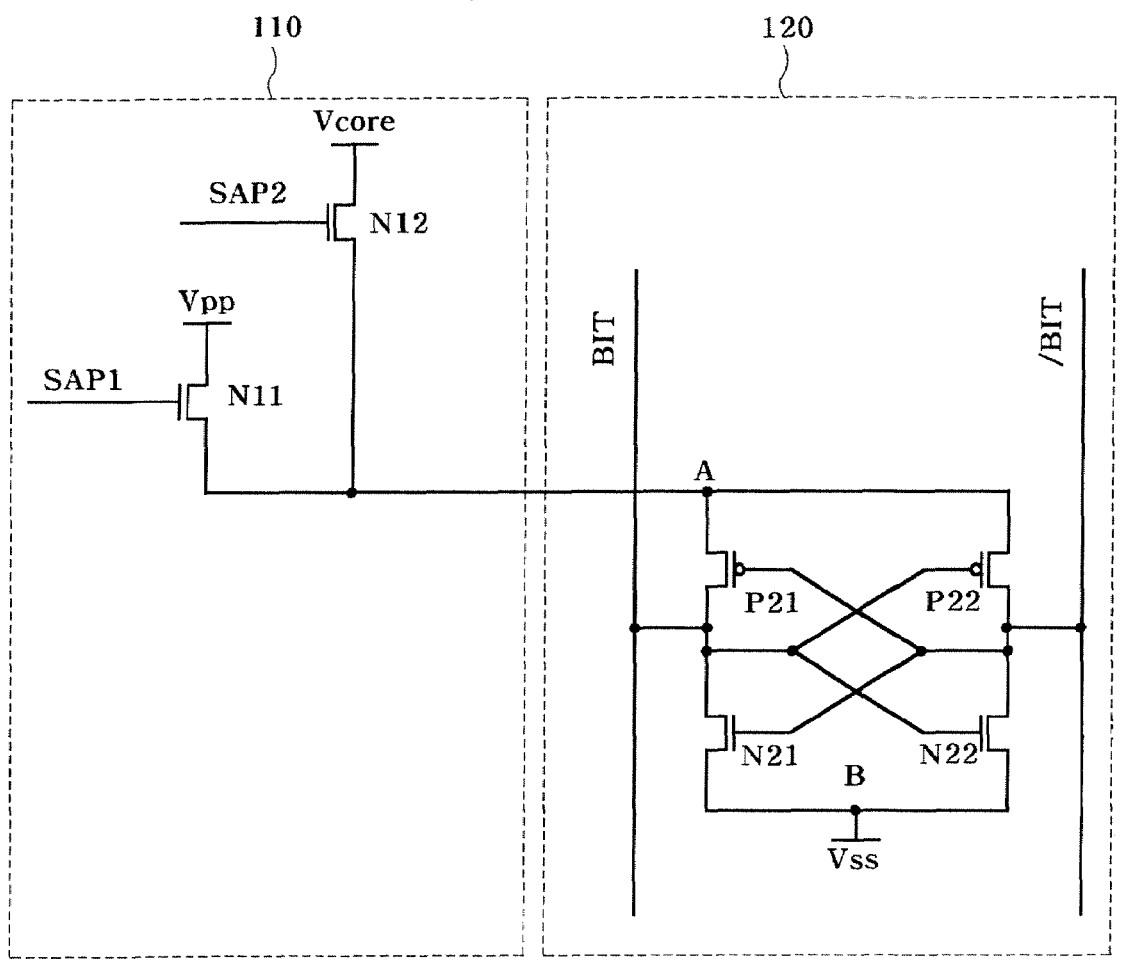
FIG. 1 is a circuit diagram showing the configuration of a conventional input/output sense amplifier and voltage supply circuit therefor.
Figure 2:
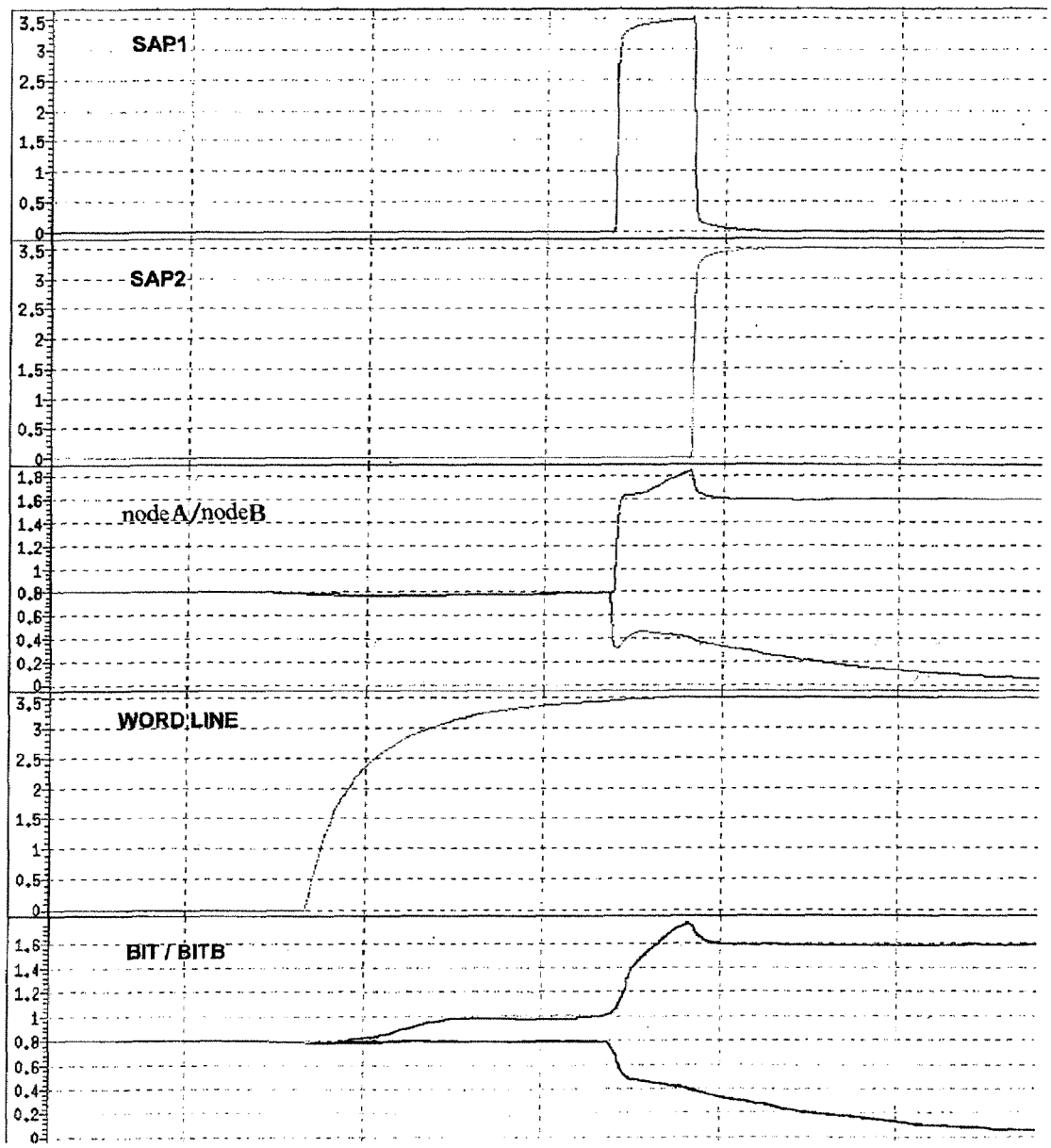
FIG. 2 is a waveform diagram of signals in FIG. 1.
Figure 3:
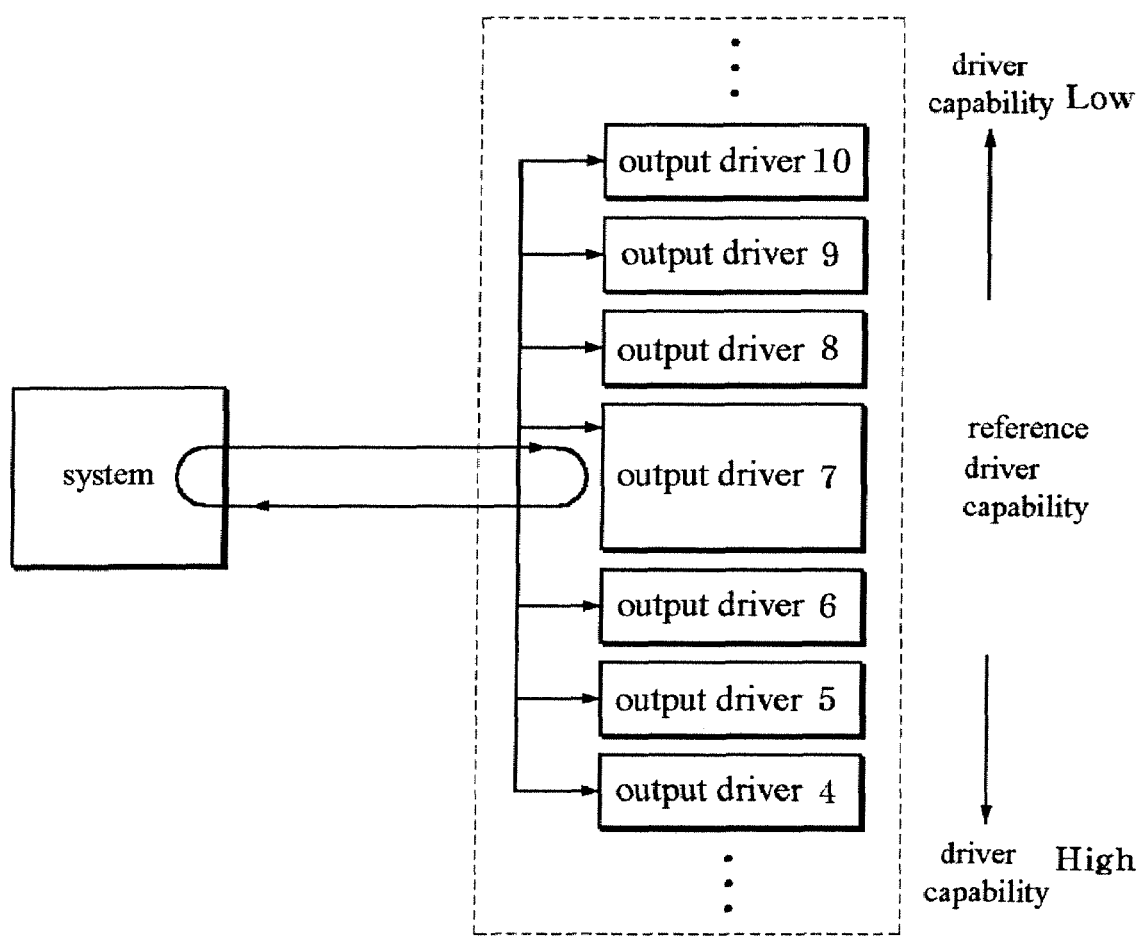
FIG. 3 is a schematic view illustrating the concept of an off-chip driver (OCD) function of a semiconductor device.

In other words, with reference to FIG. 3, if the current drive capability of the semiconductor device is lower than a predetermined reference current drive capability, the OCD function increases the number of turned-on output drivers to increase the output drive strength. On the contrary, if the current drive capability of the semiconductor device is higher than the reference current drive capability, the OCD function reduces the number of turned-on output drivers to reduce the output drive strength.

The fundamental principle of this disclosure is to apply the conceptual principle of the OCD function that adjusts the output drive strength according to a self current drive capability of a semiconductor device, to an internal voltage supply circuit that supplies an internal voltage to an input/output sense amplifier. That is, when the current drive capability of the semiconductor device is higher than a predetermined reference current drive capability, the internal voltage supply circuit makes a period in which a high voltage Vpp to be supplied to the sense amplifier is enabled, shorter than a reference period corresponding to the reference current drive capability. On the contrary, when the current drive capability of the semiconductor device is lower than the predetermined reference current drive capability, the internal voltage supply circuit makes the period in which the high voltage Vpp to be supplied to the sense amplifier is enabled, longer than the reference period corresponding to the reference current drive capability.

Figure 4:
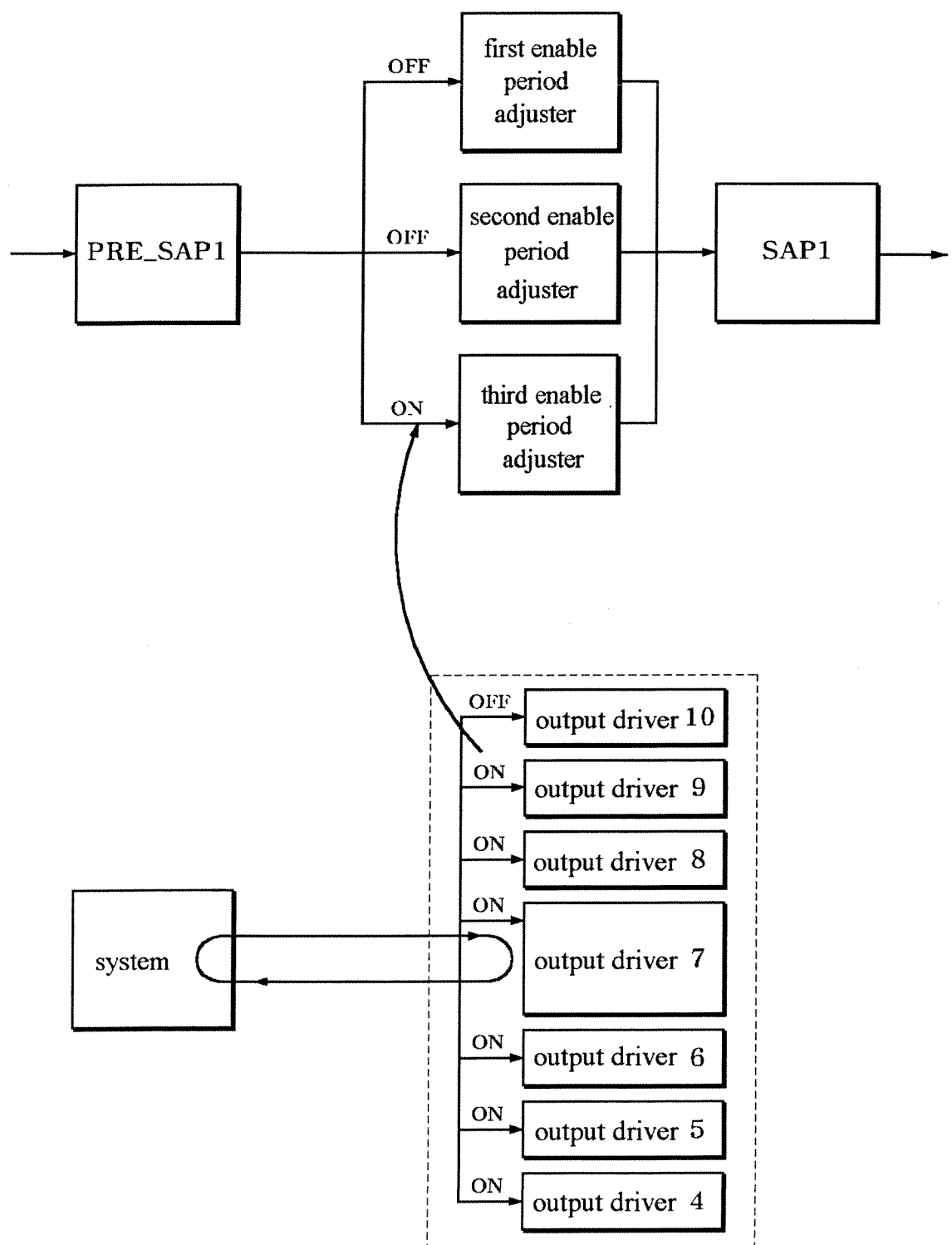
FIG. 4 is a block diagram illustrating a conventional method for adjusting an enable period of a high voltage enable signal when a current drive capability of the semiconductor device is lower than a predetermined reference current drive capability.

FIG. 4 is a block diagram illustrating a method for adjusting an enable period of a high voltage enable signal when the current drive capability of the semiconductor device is lower than the predetermined reference current drive capability. As shown in this drawing, a third enable period adjuster is turned on to output a high voltage enable signal SAP1 having a longer enable period.

Figure 5:
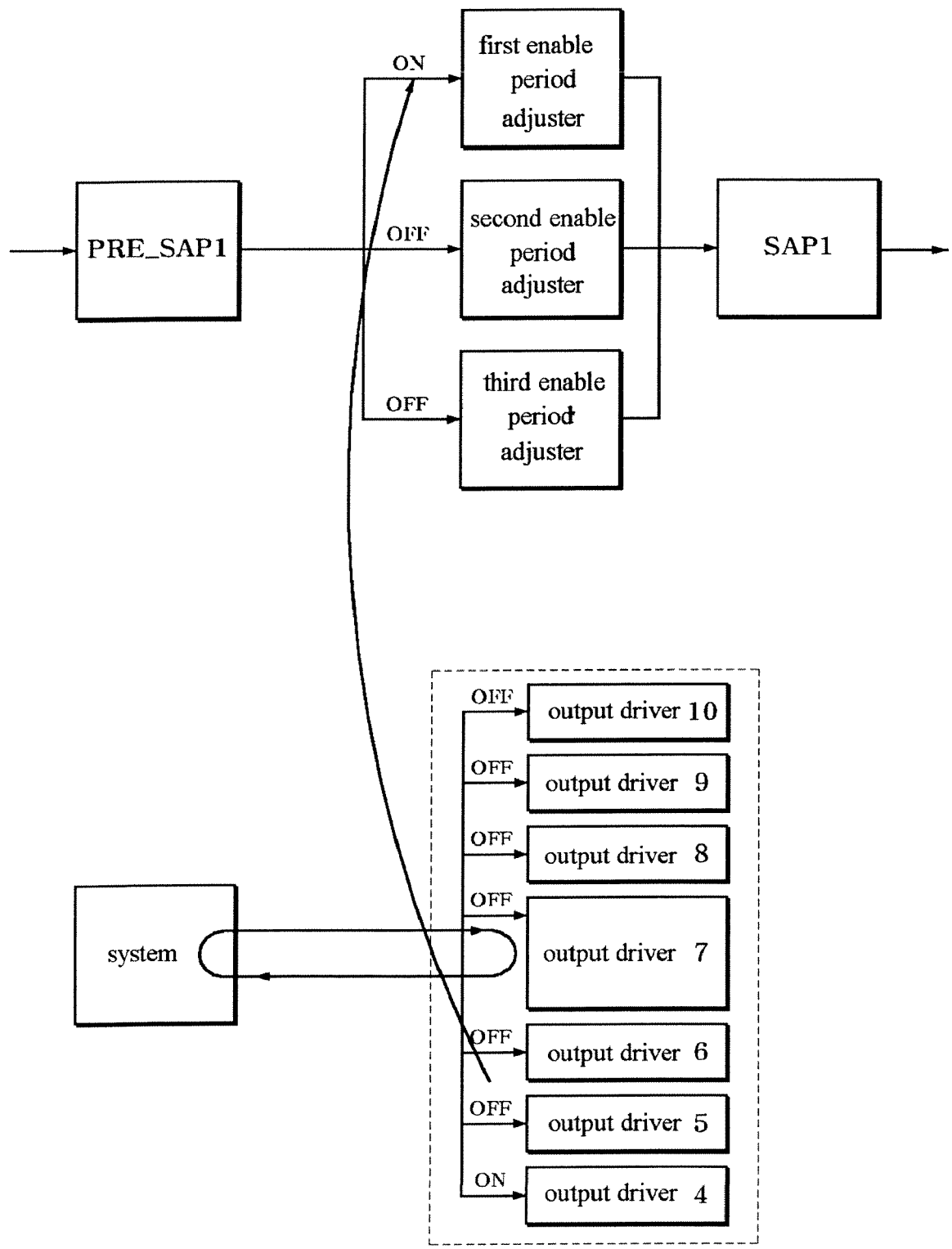
FIG. 5 is a block diagram illustrating a method for adjusting the enable period of the high voltage enable signal when the current drive capability of the semiconductor device is higher than the predetermined reference current drive capability.

FIG. 5 is a block diagram illustrating a method for adjusting the enable period of the high voltage enable signal when the current drive capability of the semiconductor device is higher than the predetermined reference current drive capability. As shown in this drawing, a first enable period adjuster is turned on to output a high voltage enable signal SAP1 having a shorter enable period.

The configuration and operation of the present invention based on the above-stated conceptual principle will hereinafter be described in more detail with reference to FIG. 6.

Figure 6:
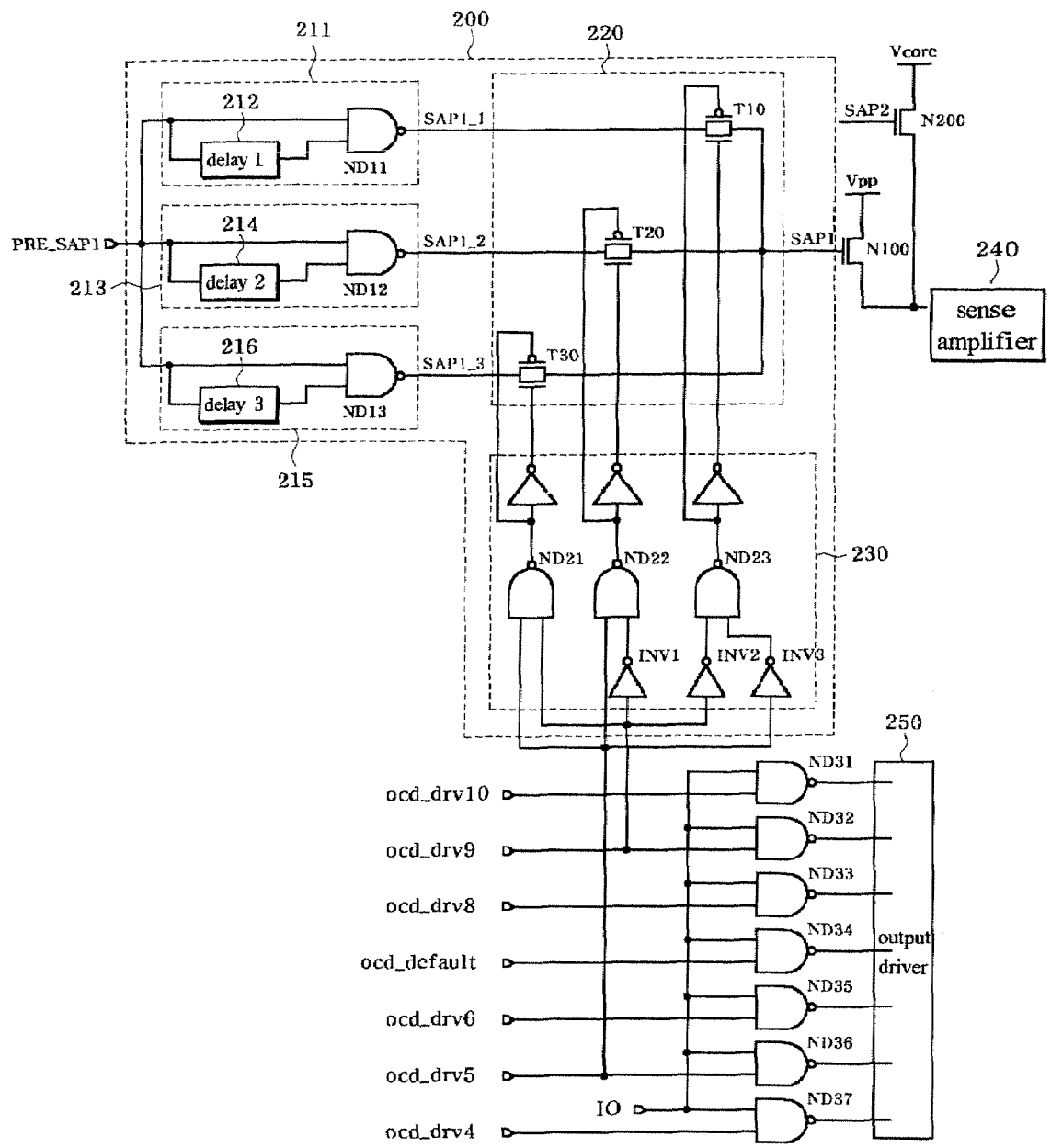
FIG. 6 is a circuit diagram showing the configuration of an internal voltage supply circuit according to one embodiment of the present invention.

FIG. 6 is a circuit diagram showing the configuration of an internal voltage supply circuit according to one disclosed embodiment. As shown in this drawing, the internal voltage supply circuit comprises an NMOS transistor N100 for supplying a high voltage Vpp in response to a high voltage enable signal SAP1, an NMOS transistor N200 for supplying a core voltage Vcore in response to a core voltage enable signal SAP2, and a high voltage enable signal generator 200 for generating the high voltage enable signal SAP1 having an enable period of a desired time according to a current drive capability of a semiconductor device. Here, the enable period is set to be shorter than a predetermined reference period when the current drive capability of the semiconductor device is higher than a predetermined reference current drive capability, and to be longer than the reference period when the current drive capability of the semiconductor device is lower than the reference current drive capability.

The core voltage enable signal SAP2 is enabled after the high voltage enable signal SAP1 is changed from its enabled state to disabled state.

The high voltage enable signal generator 200 includes a plurality of enable period adjusters 211, 213 and 215 for receiving an initial enable signal PRE_SAP1 and generating a plurality of enable signals SAP1_1, SAP1_2 and SAP1_3 having different enable periods, respectively. The enable period adjusters 211, 213 and 215 each include a delay 212, 214 or 216 for delaying the initial enable signal PRE_SAP1 by a predetermined time, and a NAND gate ND11, ND12 or ND13 for NANDing an output signal from the delay 212, 214 or 216 and the initial enable signal PRE_SAP1 and outputting the NANDed result as the enable signal SAP1_1, SAP1_2 or SAP1_3.

The high voltage enable signal generator 200 further includes a signal combiner 230 for combining a plurality of driver enable signals ocd_drv5 and ocd_drv9 for adjustment of a drive capability of an output driver 250 according to the current drive capability of the semiconductor device to generate a plurality of gate enable signals, and a transfer gate circuit 220 for outputting any one of the enable signals SAP1_1, SAP1_2 and SAP1_3 as the high voltage enable signal SAP1 in response to the gate enable signals. The transfer gate circuit 220 includes a plurality of transfer gates T10, T20 and T30 each for performing an on/off switching operation in response to a corresponding one of the gate enable signals.

Next, a detailed description will be given of the operation of the embodiment of FIG. 6 with the above-stated configuration.

In the semiconductor device of FIG. 6, the output drive strength of an output driver is determined depending on the comparison between the self current drive capability of the semiconductor device and the reference current drive capability. Here, the reference current drive capability is a standard value of the self current drive capability of the semiconductor device, which can be determined according to characteristics, functions and so forth of the semiconductor device. On the basis of this reference current drive capability, a determination is made as to whether the current drive capability of the semiconductor device is high or low.

First, when the current drive capability of the semiconductor device is equal to the reference current drive capability, the signal ocd_drv5 and signals ocd_drv4, ocd_drv6 and ocd_default, among a plurality of driver enable signals, are enabled, so the driver enable signal ocd_drv5 becomes high in level and the driver enable signal ocd_drv9 becomes too low. The driver enable signal ocd_drv5 of the high level and the driver enable signal ocd_drv9 of the low level are inputted to the signal combiner 230. As a result, in the signal combiner 230, the output of a NAND gate ND22 goes low in level and the outputs of NAND gates ND21 and ND23 go high in level, thereby causing only the transfer gate T20 to be turned on.

Consequently, the initial enable signal PRE_SAP1, after being applied to the enable period adjuster 213, is converted into a signal having an enable period of a first time which is the same as a delay time of the delay 214, and then outputted as the high voltage enable signal SAP1. The NMOS transistor N100 receives the high voltage enable signal SAP1 at its gate, supplies the high voltage Vpp to a sense amplifier 240 for the first time and is then disabled. Thereafter, the NMOS transistor N200 is enabled in response to the core voltage enable signal SAP2 to supply the core voltage Vcore to the sense amplifier 240.

On the other hand, when the self current drive capability of the semiconductor device is higher than the reference current drive capability, only the signal ocd_drv4, among the plurality of driver enable signals, is enabled, such that both the driver enable signals ocd_drv5 and ocd_drv9 become low in level. The driver enable signals ocd_drv5 and ocd_drv9 of the low level are inputted to the signal combiner 230. Accordingly, in the signal combiner 230, the output of the NAND gate ND23 goes low in level and the outputs of the NAND gates ND21 and ND22 go high in level, thereby causing only the transfer gate T10 to be turned on.

As a result, the initial enable signal PRE_SAP1, after being applied to the enable period adjuster 211, is converted into a signal having an enable period of a second time which is the same as a delay time of the delay 212, and then outputted as the high voltage enable signal SAP1. Here, the second time is set to be shorter than the first time. The NMOS transistor N100 receives the high voltage enable signal SAP1 at its gate, supplies the high voltage Vpp to the sense amplifier 240 for the second time and is then disabled. Subsequently, the NMOS transistor N200 is enabled in response to the core voltage enable signal SAP2 to supply the core voltage Vcore to the sense amplifier 240.

Accordingly, in the case where the self current drive capability of the semiconductor device is higher than the reference current drive capability, the period in which the high voltage is applied to the sense amplifier is made to be shorter than the reference period, so that unnecessary current consumption of the semiconductor device can be prevented.

On the other hand, when the self current drive capability of the semiconductor device is lower than the reference current drive capability, the signals ocd_drv4, ocd_drv5, ocd_drv6 and ocd_default and signals ocd_drv8 and ocd_drv9, among the plurality of driver enable signals, are enabled, so both the driver enable signals ocd_drv5 and ocd_drv9 become high in level. The driver enable signals ocd_drv5 and ocd_drv9 of the high level are inputted to the signal combiner 230. Accordingly, in the signal combiner 230, the output of the NAND gate ND21 goes low in level and the outputs of the NAND gates ND22 and ND23 go high in level, thereby causing only the transfer gate T30 to be turned on.

As a result, the initial enable signal PRE_SAP1, after being applied to the enable period adjuster 215, is converted into a signal having an enable period of a third time which is the same as a delay time of the delay 216, and then outputted as the high voltage enable signal SAP1. Here, the third time is set to be longer than the first time. The NMOS transistor N100 receives the high voltage enable signal SAP1 at its gate, supplies the high voltage Vpp to the sense amplifier 240 for the third time and is then disabled. Subsequently, the NMOS transistor N200 is enabled in response to the core voltage enable signal SAP2 to supply the core voltage Vcore to the sense amplifier 240.

Therefore, in the case where the self current drive capability of the semiconductor device is lower than the reference current drive capability, the period in which the high voltage is applied to the sense amplifier is made to be longer than the reference period, so that degradation of the electrical characteristics of the semiconductor device, such as drive and AC characteristics, can be avoided.

Although only two driver enable signals have been disclosed in FIG. 6 to be applied to the signal combiner 230, this disclosure is not limited thereto. For example, in order to make the high voltage enable period more precise according to the self current drive capability of the semiconductor device, more driver enable signals may be used and more enable period adjusters and more transfer gates may be installed.

As described above, the internal voltage supply circuit according to this disclosure reduces or increases a high voltage application period of an internal voltage according to differences in current drive capability among semiconductor devices based on wafer manufacturing process conditions, so as to improve electrical characteristics of the semiconductor devices, secure more stable operation characteristics thereof and reduce unnecessary current consumptions thereof, thereby increasing energy efficiencies of the semiconductor devices.

As apparent from the above description, the disclosed internal voltage supply circuit is capable of reducing or increasing a high voltage application period of an internal voltage to be used as a source voltage of an input/output sense amplifier according to differences in current drive capability among semiconductor devices based on wafer manufacturing process conditions. Therefore, it is possible to improve electrical characteristics of the semiconductor devices, secure more stable operation characteristics thereof and reduce unnecessary current consumptions thereof, so as to increase energy efficiencies of the semiconductor devices.

Although the preferred embodiments have been disclosed for illustrative purposes, those skilled in the art will appreciate that various modifications, additions and substitutions are possible, without departing from the scope and spirit of this disclosure and the accompanying claims.

What is claimed is:

1. An internal voltage supply circuit for a semiconductor device comprising:
    a voltage driver for supplying a voltage in response to a enable signal; and
    a enable signal generator for generating the enable signal having an enable period of a desired time according to a current drive capability of the semiconductor device,
    wherein the enable period is set to be shorter than a predetermined reference period when the current drive capability of the semiconductor device is higher than a predetermined reference current drive capability, and to be longer than the reference period when the current drive capability of the semiconductor device is lower than the reference current drive capability.

2. The internal voltage supply circuit as set forth in claim 1, wherein the enable signal generator includes a plurality of enable period adjusters for receiving an initial enable signal and generating a plurality of enable signals having different enable periods, respectively.

3. The internal voltage supply circuit as set forth in claim 2, wherein the enable period adjusters each include:
    a delay for delaying the initial enable signal by a predetermined time; and
    a logic device for performing a logic operation with respect to an output signal from the delay and the initial enable signal to output a corresponding one of the plurality of enable signals.

4. The internal voltage supply circuit as set forth in claim 2, wherein the enable signal generator further includes:
    a signal combiner for combining a plurality of driver enable signals for adjustment of a drive capability of an output driver according to the current drive capability of the semiconductor device to generate a plurality of gate enable signals; and
    a transfer gate circuit for outputting any one of the plurality of enable signals as the enable signal in response to the plurality of gate enable signals.

5. An internal voltage supply circuit for a semiconductor device, comprising:
    a first voltage driver for supplying a first voltage in response to a first enable signal;
    a second voltage driver for supplying a second voltage in response to a second enable signal; and
    a first enable signal generator for generating the first enable signal having an enable period set according to the current drive capability of the semiconductor device,
    wherein each of the first voltage and second voltage is used as a source voltage of an input/output sense amplifier of the semiconductor device
    wherein the first enable signal generator includes a plurality of enable period adjusters for receiving an initial enable signal and generating a plurality of enable signals having different enable periods, respectively.

6. The internal voltage supply circuit as set forth in claim 5, wherein the second enable signal is enabled after the first enable signal is changed from its enabled state to a disabled state.

7. The internal voltage supply circuit as set forth in claim 5, wherein the enable period adjusters each include:
    a delay for delaying the initial enable signal by a predetermined time; and
    a logic device for performing a logic operation with respect to an output signal from the delay and the initial enable signal to output a corresponding one of the plurality of enable signals.

8. The internal voltage supply circuit as set fort in claim 5, wherein the first enable signal generator further includes:
    a signal combiner for combining a plurality of driver enable signals for adjustment of a drive capability of an output driver according to the current drive capability of the semiconductor device to generate a plurality of gate enable signals; and
    a transfer gate circuit for outputting any one of the plurality of enable signals as the first enable signal in response to the plurality of gate enable signals.

9. The internal voltage supply circuit as set forth in claim 5, wherein the first voltage is a high voltage and the second voltage is a core voltage.

10. An internal voltage supply circuit for a semiconductor device, comprising:
    a voltage driver for supplying a voltage for providing a first voltage and a second voltage in response to an enable signal; and
    a enable signal generator for generating the enable signal having an enable period set according to the current drive capability of the semiconductor device,
    wherein each of the first voltage and second voltage is used as a source voltage of an input/output sense amplifier of the semiconductor device
    wherein the enable signal generator includes a plurality of enable period adjusters for receiving an initial enable signal and generating a plurality of enable signals having different enable periods, respectively.

11. The internal voltage supply circuit as set forth in claim 10, wherein the enable period adjusters each include:
    a delay for delaying the initial enable signal by a predetermined time; and
    a logic device for performing a logic operation with respect to an output signal from the delay and the initial enable signal to output a corresponding one of the plurality of enable signals.

12. The internal voltage supply circuit as set forth in claim 10, wherein the enable signal generator further includes:
    a signal combiner for combining a plurality of driver enable signals for adjustment of a drive capability of an output driver according to the current drive capability of the semiconductor device to generate a plurality of gate enable signals; and
    a transfer gate circuit for outputting any one of the plurality of enable signals as the enable signal in response to the plurality of gate enable signals.

* * * * *